United States Patent
Akram et al.

[11] Patent Number: 6,002,174
[45] Date of Patent: Dec. 14, 1999

[54] BARRIER MATERIALS FOR SEMICONDUCTOR DEVICES

[75] Inventors: Salman Akram; Scott Meikle, both of Boise, Id.

[73] Assignee: Micron Technology, Inc., Boise, Id.

[21] Appl. No.: 09/002,203

[22] Filed: Dec. 31, 1997

[51] Int. Cl.[6] .......................... H01L 23/48; H01L 23/52; H01L 29/40
[52] U.S. Cl. .......................... 257/751; 257/761; 257/762; 257/763; 257/764; 257/765; 257/766
[58] Field of Search .......................... 257/751, 761–766; 438/753, 750

[56] References Cited

U.S. PATENT DOCUMENTS

| | | | |
|---|---|---|---|
| 4,990,997 | 2/1991 | Nishida | 357/71 |
| 5,093,710 | 3/1992 | Higuchi | 357/71 |
| 5,231,306 | 7/1993 | Meikle et al. | 257/751 |

*Primary Examiner*—Mahshid Saadat
*Assistant Examiner*—Jhihan B Clark
*Attorney, Agent, or Firm*—Fletcher, Yoder & Van Someren

[57] ABSTRACT

A barrier material deposited as a barrier film layer in a semiconductor device to reduce the interdiffusion of materials of varying electrical conductivity comprising adjacent layers in a semiconductor device is provided. The barrier material contains a transition metal, aluminum, silicon and nitrogen as essential ingredients. Suitable transition metals are tantalum and titanium. The material provides excellent resistance to diffusion across the range of temperatures occurring in an integrated circuit manufacturing process. The material also exhibits good adhesion to materials used in semiconductor processes.

23 Claims, 1 Drawing Sheet

BARRIER MATERIALS FOR SEMICONDUCTOR DEVICES

BACKGROUND OF THE INVENTION

1. Field of the Invention

The invention relates in general to the field of integrated circuit manufacturing technology and, more particularly, to a new material which can be deposited as a layer onto a semiconductor wafer to serve numerous purposes, including acting as an interdiffusion barrier or an adhesion promoter.

2. Description of the Related Art

In the manufacturing of integrated circuits, which are also referred to as semiconductor devices, numerous microelectronic circuits are simultaneously manufactured on semiconductor substrates. These substrates are referred to as wafers. A typical semiconductor wafer is comprised of a number of die. Each die contains at least one microelectronic circuit, which is typically replicated across all of a wafer's dies. One example of a microelectronic circuit which can be fabricated in this way is a dynamic random access memory or "DRAM".

Although referred to as semiconductor devices, integrated circuits are in fact fabricated from and contain numerous materials of varying electrical properties. These include insulators or dielectrics, such as silicon dioxide, and conductors, such as aluminum or tungsten, in addition to semiconductors, such as silicon and germanium. The most common semiconductor employed is silicon.

In state of the art integrated circuits, it is common for the design to require interfaces between layers of varying electrical properties. The interface between the two layers may constitute the entire surface of the die, or the interface may occur when conductive paths or openings are formed to connect or complete different circuits that have been fabricated within a die. One method to complete different circuits is through the use of conductive paths in or on an insulative layer which provide for an interface between a conductive, typically metal, layer and a semiconductive substrate, typically a silicon layer. Conductive paths of this variety are typically referred to as contact openings or contacts. The contact opening allows for an interface between the underlying semiconductive layer and the subsequently deposited conductive layer.

It is common for a design to require an interface between other layers, such as between two different layers of metallic conductors, between an insulator and a metal conductor, between an oxide and a semiconductor, and between two different semiconductors. Interfaces between other layers are also known. Again, these interfaces may constitute the entire surface area of a die or they may be restricted to the narrow recesses of a conductive path formed between the two layers. Conductive paths providing an interface between pairs of layers may be referred to in the art as contacts or contact openings, or they may be referred to as vias or some other term. Because of the inconsistent use of these terms, the term conductive path will be used herein to refer to such openings formed in a semiconductor process to connect layers regardless of which layers are thereby connected.

There are several difficulties inherent to these interfaces. One difficulty is due to the existence of common fabrication steps which require protracted annealing of the devices at elevated temperatures, often in excess of 500° C. These temperatures are especially problematic for interfaces between semiconductor and conductor. At these temperatures the metallic conductor and the semiconductor can rapidly interdiffuse into the adjacent region. The interdiffusion of these materials is driven by the concentration gradients. This leads to a lower energy state of the composite material, which is the preferred stable state. This desire or trend toward a lower energy state is embodied in the Second Law of Thermodynamics which states, in effect, that whenever a spontaneous event takes place in the universe, it is accompanied by an overall increase in the degree of randomness (i.e., an increase in entropy). As a practical consequence of the Second Law of Thermodynamics, matter has a tendency to diffuse from areas of high concentration (i.e., high energy) to low concentration (i.e., low energy); hence, the interdiffusion of conductive and semiconductive layers. The interdiffusion changes the electrical properties of the two regions and in particular the semiconductor region, resulting in an increased likelihood of the production of inoperative devices. The interdiffusion of the two regions can also occur at room temperature, although at a much slower diffusion rate. Interdiffusion between other layers may also occur, increasing the likelihood of producing inoperable devices.

These interdiffusion concerns generally have dictated the need for a barrier material to be deposited at the interface of the two layers when there is sufficient concern over interdiffusion of the two regions. Specifically the barrier material is deposited onto the surface of one layer prior to the deposition of another layer onto the barrier layer. For example, a barrier material can be deposited into a contact opening to prevent the interdiffusion between an underlying semiconductor layer and a subsequently deposited conductor layer. Titanium nitride (TiN) and titanium tungsten (TiW) are typical of the compounds used as barrier materials (i.e., to form a barrier layer). The barrier materials are typically deposited as a thin film or layer over the exposed surface of the die, including any intended interface. The deposited surfaces would include the walls and base of conductive paths. The thickness of these barrier films is typically in the range of 200 Å to 1000 Å although the use of films of other thicknesses is known.

A second difficulty associated with these interfaces is a corollary to the first. Despite interdiffusion concerns, good contact between successive layers of the integrated circuit should be maintained. Therefore, any layer employed as a barrier layer to minimize interdiffusion should exhibit good adhesion qualities to the adjacent layers. Indeed, a thin film may be deposited strictly because of its adhesive properties when the two adjacent layers do not readily adhere to each other. Finally, barrier layers can also be used to tailor the electrical properties of contacts.

One difficulty that limits the widespread use of certain materials as barrier and adhesive layers is their effectiveness at higher temperatures. Although generally effective at room temperature, certain materials may lose their barrier or adhesive properties at the high temperatures to which semiconductors are necessarily exposed. Barrier layers composed of TiN and TiW generally suffer from this limitation. Elevated temperatures are not only common for annealing steps but are often dictated by the limitations of the deposition techniques used to deposit materials onto the semiconductor wafer. Thus, a barrier material which does not exhibit a loss in either its barrier or adhesive properties at elevated temperatures would be extremely useful.

A further complication in integrated circuit manufacturing is the ever increasing trend of reducing the size of the microelectronic circuits. As the size of these circuits, and therefore the size of die regions, decreases, the number of devices produced from any one wafer increases dramatically. However, as the size of these devices decreases, the percentage of reliable circuits produced on any one wafer becomes highly dependent on the ability to deposit films, including films deposited for barrier and adhesive purposes, uniformly across surfaces. These size reductions dictate that barrier materials be deposited at ever decreasing thicknesses, which means that these barriers are even more susceptible to elevated temperatures and the disastrous effects these temperatures can have on interdiffusion. Therefore, one requirement for any new barrier material, deposited as a barrier film or layer, would be that it exhibit greater inherent resistance to thermal energy than those materials previously employed. Additionally, it would be preferred that the adhesion properties of new barrier materials be at least as good as those previously employed. Finally, the trend in size reduction also dictates that new barrier materials must yield deposited films exhibiting greater uniformity in thickness (i.e. they must exhibit improved step coverage) than previous materials. The goal is to avoid the deposition of a barrier film which has holes or gaps within it. If present, these holes or gaps would tend to reduce the barrier properties of the film. As a corollary to this requirement, it would be preferable that any new material used as a barrier or adhesive layer could be deposited by those techniques currently used to deposit thin uniform films. Sputter deposition, chemical vapor deposition, and plasma enhanced chemical vapor deposition are the techniques most commonly employed to deposit the thin films of interest.

SUMMARY OF THE INVENTION

In accordance with one aspect of the invention, barrier layers can be deposited in a semiconductor process. The barrier layers prevent the interdiffusion of material comprising adjacent layers of a semiconductor device. In particular, the barrier layers act as diffusion barriers to prevent the interdiffusion of a conductor, typically a metal, and a semiconductor, typically silicon, across the broad range of temperatures that the semiconductor device is subjected to. The barrier layer comprises a composition containing varying amounts of a transition metal, aluminum, silicon, and nitrogen. Preferred transition metals include titanium and tantalum although other transition metals may be effectively employed. The barrier layer contains, by weight, from about 1% to about 95% transition metal, from about 1% to about 95% aluminum, from about 0.2% to about 95% silicon, and from about 1% to about 60% nitrogen. Preferably, the barrier layer contains from about 15% to about 80% transition metal, from about 5% to about 60% aluminum, from about 0.2% to about 20% silicon, and from about 20% to about 60% nitrogen. Even more preferably, the barrier layer contains from about 30% to about 40% transition metal, from about 10% to about 20% aluminum, from about 0.5% to about 10% silicon, and from about 40% to about 50% nitrogen.

The barrier layers of the present invention also act as adhesive layers between adjacent layers in a semiconductor device. The barrier layers are deposited upon the exposed horizontal surface of the device, but they are also deposited upon any other exposed surface, including both vertical walls and horizontal base of the narrow conductive paths that may be formed in a device.

In accordance with another aspect of the invention, the barrier layers previously identified are further described as having been deposited onto a surface of a semiconductor device by methods which include reactive sputtering, chemical vapor deposition, and plasma enhanced chemical vapor deposition.

In accordance with still another aspect of the invention, a semiconductor device is provided which comprises a semiconductor substrate layer and a barrier layer of the type previously identified.

In accordance with yet another aspect of the invention, a semiconductor device is provided which comprises a conductive layer in addition to a semiconductive substrate layer and a barrier layer of the type previously identified.

In accordance with a further aspect of the invention, there is provided a semiconductor device obtained by the steps of providing a semiconductive substrate layer and creating a barrier layer of the type previously identified.

In accordance with an even further aspect of the invention, there is provided a semiconductor process which comprises the steps of providing a semiconductor substrate layer and creating a barrier layer of the type previously identified. Also provided is a semiconductor device obtained by the process. The barrier layer is deposited by methods known in the art including sputter deposition, chemical vapor deposition, and plasma enhanced chemical vapor deposition. Sputter deposition is particularly preferred.

In accordance with a still further aspect of the present invention, there is provided a barrier layer of the type previously identified between two metal lines.

BRIEF DESCRIPTION OF THE DRAWINGS

The foregoing and other advantages of the invention will become apparent upon reading the following detailed description and upon reference to the drawings in which.

DESCRIPTION OF SPECIFIC EMBODIMENTS

In the interest of clarity, not all features of an actual implementation into an integrated circuit process (i.e., semiconductor process) are described in this specification. This illustration is restricted to those aspects of a semiconductor process involving the deposition of thin films that can be deposited as layers, typically barrier or adhesive layers, in semiconductor processes. Conventional details of semiconductor processes, such as mask generation, resist casting, resist development, etching, doping, cleaning, implantation and annealing are not presented as such details are well known in the art of integrated circuit manufacture.

Figure 1:
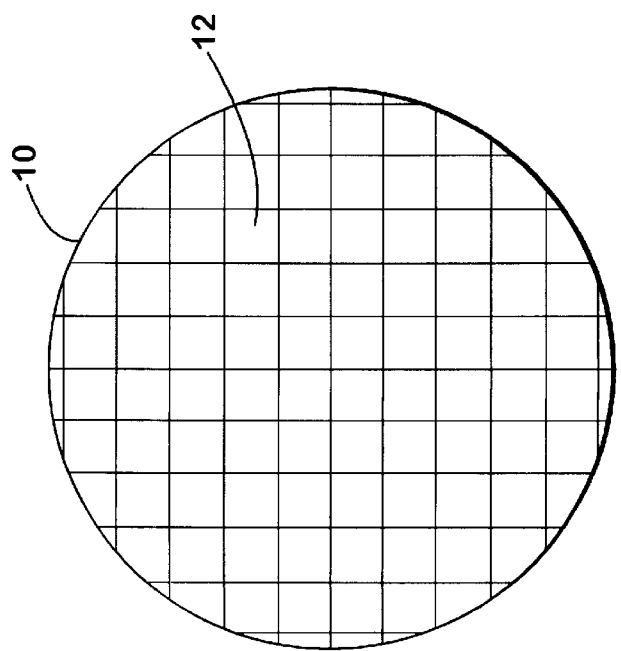
FIG. 1 shows a block diagram view of a semiconductor wafer and one of its constituent die regions.
Figure 2:
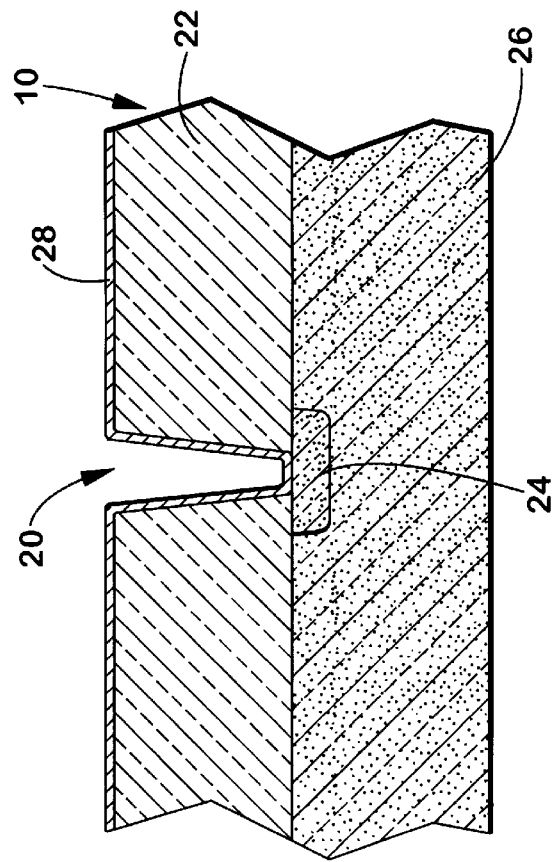
FIG. 2 is a diagrammatic cross-section of a semiconductor wafer processed in accordance with one aspect of the present invention, wherein a thin barrier film has been deposited onto the surface of a die including the surfaces of a contact opening.

Turning now to the drawings, a typical semiconductor wafer 10, as shown in FIG. 1, is comprised of a number of different regions, known as die regions 12. A semiconductor wafer 10 produced in accordance with one embodiment of the invention is depicted in FIG. 2. A wafer 10 includes an enhanced doped region 24, which may be obtained by an implantation process within a semiconductive substrate layer 26. The semiconductive substrate layer 26, generally comprising silicon, is coated with an insulative layer 22, predominately boron-phosphorus-silicon glass (BPSG), which is etched to form conductive paths 20 through the insulative layer 22. By one of the methods described, a barrier layer 28 is deposited across the wafer such that it lines a conductive path 20. The barrier layer 28 is comprised of a composition containing a transition metal, aluminum, silicon, and nitrogen. Preferred transition metals are tantalum and titanium although other transition metals may be effectively employed. Preferably the composition comprising the barrier film layer 28 is deposited as an alloy of the transition metal, aluminum, silicon, and aluminum. This alloy may be referred to herein for convenience as MAlSiN, in which "M" refers to the transition metal, "Al" refers to aluminum, "Si" refers to silicon, and "N" refers to nitrogen. When a preferred transition metal, such as titanium (Ti) or tantalum (Ta), is expressly provided for, the symbol for this preferred transition metal will replace "M" in this shorthand description. This reference, MAlSiN, should not be construed as indicating any particular manner or form in which the elements are combined in the barrier layer 28. To the contrary, the shorthand reference is only intended to indicate which particular elements are contained within the barrier layer 28.

In this specification the term "alloy" means a solid mixture. It does not necessarily indicate that the "alloy" or "mixture" is comprised primarily of metallic elements. The mixture is not necessarily completely homogeneous on a microscopic scale, and, in fact, it is expected that the relative concentration of each element will vary to some degree throughout the diffusion barrier. However, for each element, a concentration gradient with minimum and maximum extremes at the boundaries of the barrier layer 28 does not exist, as there is admixture of all the elements throughout the barrier layer 28.

The barrier layer 28 contains, by weight, from about 1% to about 95% transition metal, from about 1% to about 95% aluminum, from about 0.2% to about 95% silicon, and from about 1% to about 60% nitrogen. Preferably, the barrier layer 28 contains from about 15% to about 80% transition metal, from about 5% to about 60% aluminum, from about 0.2% to about 20% silicon, and from about 20% to about 60% nitrogen. Even more preferably, the barrier layer 28 contains from about 30% to about 40% transition metal, from about 10% to about 20% aluminum, from about 0.5% to about 10% silicon, and from about 40% to about 50% nitrogen. Preferably, the barrier film layer 28 is electrically semiconductive.

The barrier layer 28 exhibits good adhesion to the conductive path 20 and the enhanced doped region 24 and, also, exhibits good step coverage. The barrier layer 28 deposited as described reduces interdiffusion of the silicon of the semiconductive substrate layer 26 and any metal subsequently deposited as part of a conductive layer 21. The barrier layer 28 may be deposited onto the enhanced doped region 24 of the semiconductive substrate layer 26 as indicated in FIG. 2. However, the use of the barrier layer 28 of the present invention is not limited to this embodiment. Indeed, the barrier layer 28 may be deposited onto any exposed surface of the typically silicon-containing semiconductive substrate layer 26 or any other suitable surface. Moreover, the term "silicon" as used here to describe the composition of the semiconductive substrate layer 26 is also intended to encompass silicon-containing compounds, such as silicon dioxide and silicon nitride.

Figure 3:
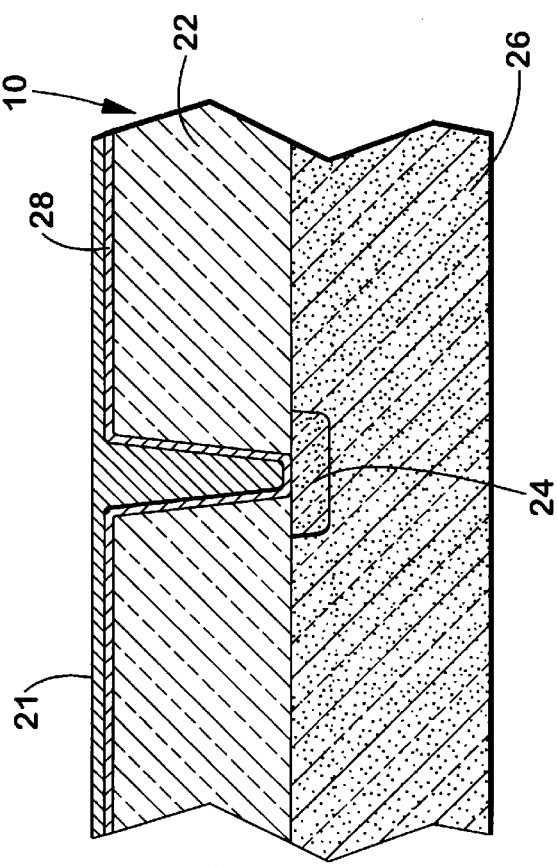
FIG. 3 is a diagrammatic cross-section of a semiconductor wafer processed in accordance with one aspect of the present invention, wherein a conductive layer has been deposited onto the thin film previously deposited.

The subsequent deposition of a conductive layer 21 is indicated in FIG. 3. Aluminum is typically used to form the conductive layer 21 although other conductive materials, such as tungsten or copper, may be used. The barrier layer 28 thus deposited also acts as an adhesive layer between the semiconductive substrate layer 26 and any subsequently deposited conductive layer 21. When the barrier layer 28 is deposited as indicated in FIG. 3, the result can be characterized in two ways. In the area of the semiconductor device encompassing the conductive path 20, a three layer structure consisting of a semiconductive substrate layer 26, a barrier layer 28, and a conductive layer 21 exists. In all other areas of the semiconductor device, a four layer structure exists with a insulative layer 22 located between the barrier layer 28 and the semiconductive substrate layer 26.

Interfaces between conductive layers 21 and semiconductive layers, including semiconductive substrate layers 26, occur frequently in the designs for semiconductor devices. They may appear in the manner indicated in FIG. 3, or they may appear in other arrangements as well. In particular, interfaces between aluminum (conductor) and silicon (semiconductor) as depicted in FIG. 3 are common. When deposited as a barrier layer 28 between a conductive layer 21 and an enhanced doped region 24 of a semiconductive substrate layer 26, barrier materials comprising a composition of aluminum, silicon, nitrogen, and a transition metal preferably selected from titanium and tantalum reduce the interdiffusion of the conductive and semiconductive materials of the adjacent layers. In particular, unlike compositions of titanium and nitrogen in the form of TiN, titanium and tungsten in the form of TiW, and elemental Ti, these barrier layers 28 exhibit excellent barrier properties (i.e., thermal resistance) over a wide range of temperatures, including those in excess of 500° C. often associated with annealing and deposition steps. These barrier layers 28 also exhibit excellent adhesion over a wide range of temperatures to layers in a semiconductor device, including in particular semiconductive substrate layers 26 and conductive layers 21.

An additional advantage of these barrier layers 28 is afforded by the inclusion, within the composition, of those elements which typically comprise the adjacent layers in the semiconductor device, namely silicon and aluminum. This advantage is due to the fact that, because of the Second Law of Thermodynamics, material composing an enhanced doped region 24 of a semiconductive substrate layer 26, for example silicon, will not only have a tendency to diffuse into an adjacent conductive layer 21, but will also have a tendency to diffuse into a barrier layer 28 deposited to prevent the initial diffusion concern. Diffusion of a conductive material from the conductive layer 21 into the barrier film layer 28 may also occur. Because of this, current barrier layers composed of materials like TiN can be expected to contain from 0.001% to 0.1% aluminum and silicon respectively when the adjacent semiconductive substrate layer 26 and conductive layer 21 consist essentially of these elements. By incorporating elements into the barrier layer 28 which are contained within the adjacent layers, diffusion is minimized. Diffusion of a particular element into the barrier layer 28 will only be significantly mitigated if the concentration of the particular element incorporated in the barrier film layer 28 exceeds that amount that can normally be expected to diffuse into the barrier layer 28. The concentrations of aluminum and silicon in the barrier film layer 28 should therefore be in excess of 0.2% when it is sought to minimize the diffusion of these elements. In these instances, further diffusion is significantly reduced because diffusion of a particular element, if it were to occur, would not result in an area of lower concentration. Therefore, the inclusion of silicon in the barrier film layer 28 will reduce the diffusion tendency of silicon contained in an adjacent semiconductive substrate layer 26, and the inclusion of aluminum will reduce the diffusion tendency of aluminum contained in an adjacent conductive layer 21. Likewise, the inclusion of a transition metal, such as tantalum or titanium, will reduce the diffusion tendency of these elements if they are contained within an adjacent conductive layer 21. It should be noted, however, that it is not a requirement that tantalum be employed only when adjacent layers contain tantalum, that aluminum be employed only when adjacent layers contain aluminum, or that titanium be employed only when adjacent layers contain titanium. Likewise, diffusion into a barrier layer of elements comprising other layers (i.e., layers other than a semiconductive substrate layer 26 and conductive layer 21) in a semiconductor device can be minimized by incorporating those elements into a barrier layer placed between the two layers.

The barrier layer 28 differs in another way from those previously known barrier layers 28 consisting essentially of a transition metal nitride that contained aluminum and silicon as a result of diffusion from adjacent layers. These previously known barrier layers 28 are characterized by a concentration gradient for the aluminum and silicon contained therein. The concentration of either one of these elements is at its highest near the interface with the adjacent layer containing the particular element. Concentration decreases significantly as one moves away from this interface. The result is a barrier layer 28 having a high concentration of aluminum and hardly any silicon in that portion of the film adjacent to the conductive layer 21 and a high concentration of silicon and hardly any aluminum in that portion of the film adjacent to the semiconductive substrate layer 26. The term "high" in the previous sentence is relative, as the total concentration of aluminum or silicon is not expected to exceed 0.1% in these previously known barrier layers 28. In contrast, the barrier layers 28 are characterized by a more homogeneous distribution of the deposited elements. Individual atoms of the chosen transition metal, aluminum, silicon, and nitrogen can be expected to be located throughout the barrier layer 28.

These barrier materials can be deposited onto the surface of a semiconductor by any of the known techniques. However, to deposit these barrier materials in a conductive path 20 to form a barrier layer 28 between a conductive layer 21 and a semiconductive substrate layer 26, the deposition method employed should be capable of depositing thin films, generally less than 3000 Å, which exhibit high purity and density and relatively uniform step coverage. The thickness of the barrier layer 28 is preferably about 50 Å to 2000 Å. Reactive sputtering, chemical vapor deposition, and plasma enhanced chemical vapor deposition techniques generally known in the art can be used.

Fabrication of a semiconductor device incorporating a barrier layer 28 of one embodiment of the present invention comprises the steps of providing a semiconductive surface and creating a barrier layer containing a transition metal, aluminum, silicon, and nitrogen. The fabrication further comprises the step of creating a conductive layer on the barrier layer. This step comprises creating a layer of aluminum or copper. The step of providing a semiconductor substrate comprises providing a semiconductor wafer having a semiconductive substrate layer 26. This semiconductive substrate layer 26 is comprised of silicon, and preferably the silicon is doped. Alternatively, this semiconductive substrate layer is comprised of silicon dioxide or another silicon containing compound. The transition metal is selected from titanium and tantalum. Preferably, the step of creating the barrier layer is accomplished by reactive sputtering.

When reactive sputtering is employed, a target containing the transition metal, aluminum, and silicon is preferably used as the source of these elements. The target and the wafer upon which the elements are to be deposited upon are contained within a sputtering chamber. The target is bombarded with positive inert ions with kinetic energy far exceeding the heat of sublimation of the target elements. This bombardment results in the dislodging of target atoms and their ejection into the gas phase succeeded by their deposition onto the substrate or other depositing surface. In this instance, the gas space in the chamber contains nitrogen and may additionally contain argon. A typical and acceptable argon/nitrogen ratio is 70%/30%.

As known in the art, the composition of the deposited barrier layer 28 can be controlled by altering the composition of the target and the kinetic energy of the ions used to bombard the target. Sputter conditions typically employed in the field are acceptable for the deposition of the barrier layers 28 of this invention. Preferable conditions include power levels between about 5 kW and about 20 kW, temperatures between about 150° C. and about 300° C., and pressures between about 1 millitorr and about 10 millitorr. A temperature about 200° C. is particularly preferred.

When chemical vapor deposition or plasma enhanced chemical vapor deposition methods known in the art are employed, individual sources of the desired transition metal, aluminum, and silicon as known in the art can be employed. For the transition metal and aluminum, these sources may be organometallic. For the transition metal, acceptable organometallic precursors include those of the general formula $M(NR_2)_x$, where M is the desired transition metal, R is either hydrogen (H) or a carbon containing radical, and x is equal to the oxidation state of the transition metal M. The preferred transition metals are titanium and tantalum. For titanium, x will typically be 4. For tantalum, x will typically be 5. Known and acceptable organometallic sources for titanium include $Ti(N(CH_3)_2)_4$ and $Ti(N(C_2H_5))_4$. Similarly known organometallic sources of tantalum and aluminum, such as dimethylethylamine (DMEAA) or dimethylaluminumhydride (DMAH), are acceptable. For silicon, typical and acceptable sources are hydrides such as $SiH_4$. Nitrogen is generally provided by a gaseous source, such as $N_2$, $NH_3$, or hydrazine containing sources.

Regardless of the deposition method employed, the deposited barrier layer 28 should comprise by weight from about 1% to about 95% transition metal, from about 1% to about 95% aluminum, from about 0.2% to about 95% silicon, and from about 1% to about 60% nitrogen.

Preferably, the barrier layer 28 contains from about 15% to about 80% transition metal, from about 5% to about 60% aluminum, from about 0.2% to about 20% silicon, and from about 20% to about 60% nitrogen. Even more preferably, the barrier layer 28 contains from about 30% to about 40% transition metal, from about 10% to about 20% aluminum, from about 0.5% to about 10% silicon, and from about 40% to about 50% nitrogen.

In other embodiments, the described material can be deposited between other layers in a semiconductor device. These would include, but are not limited to, between two different layers of metallic conductors; between an insulator and a metal conductor; between an oxide and a semiconductor; and between two different semiconductors. The barrier materials could therefore be employed not only to deposit thin films of a composition containing a transition metal, aluminum, silicon, and nitrogen along the surfaces of any conductive path 20, but also to deposit these same films along any surface in a semiconductor device.

In another embodiment, a semiconductor device is provided that includes a semiconductive substrate layer 26 and a barrier layer 28 comprising a composition composed of varying amounts of a transition metal, aluminum, silicon, and nitrogen deposited onto the semiconductive substrate layer 26, wherein preferred transition metals include tantalum and titanium. Preferably, the device further comprises a conductive layer 21 deposited onto the barrier layer 28, wherein the conductive layer 21 generally comprises a metal such as aluminum. Without regard to the layers between which the composition is deposited, the thickness of this material, used as a barrier layer 28, is typically between 50 Å and 2000 Å thick although films of other thicknesses are known. The composition, deposited as a barrier layer 28, is comprised by weight from about 1% to about 95% transition metal, from about 1% to about 95% aluminum, from about 0.2% to about 95% silicon, and from about 1% to about 60% nitrogen. Preferably, the barrier layer 28 contains from about 15% to about 80% transition metal, from about 5% to about 60% aluminum, from about 0.2% to about 20% silicon, and from about 20% to about 60% nitrogen. Even more preferably, the barrier layer 28 contains from about 30% to about 40% transition metal, from about 10% to about 20% aluminum, from about 0.5% to about 10% silicon, and from about 40% to about 50% nitrogen.

Although the primary use of the described composition is as a layer deposited in a conductive path 20 as a barrier layer 28 between an underlying semiconductive substrate layer 26 and a subsequently deposited conductive layer 21, the composition can be used between other layers of a semiconductor device to provide barrier or adhesive properties. The composition can be deposited at any surface defining an interface between layers of interest, including the vertical walls and horizontal base of conductive paths.

In yet another aspect, there is provided a semiconductor process which comprises the stops of providing a semiconductive substrate layer 26 and creating a barrier layer 28 comprising by weight from about 1% to about 60% nitrogen. Preferably, the barrier layer 28 contains from about 15% to about 80% transition metal, from about 5% to about 60% aluminum, from about 0.2% to about 20% silicon, and from about 20% to about 60% nitrogen. Even more preferably, the barrier layer 28 contains from about 30% to about 40% transition metal, from about 10% to about 20% aluminum, from about 0.5% to about 10% silicon, and from about 40% to about 50% nitrogen. The barrier layer can be deposited by a technique chosen from reactive sputtering, chemical vapor deposition, and plasma enhanced chemical vapor deposition. In yet another aspect, there is provided semiconductor devices obtained by this process.

While the invention is susceptible to various modifications and alternative forms, specific embodiments have been shown by way of example in drawings and have been described in detail herein. However, it should be understood that the invention is not intended to be limited to the particular forms disclosed. Rather, the invention is to cover all modifications, equivalents, and alternatives falling within the spirit and scope of the invention as defined by the appended claims.

What is claimed is:

1. A barrier layer on a semiconductor device formed of a composition comprising:

a transition metal;

aluminum;

silicon; and nitrogen, wherein the composition comprises between about 30% and about 40% of the transition metal, between about 10% and about 20% of the aluminum, between about 0.5% and about 10% of the silicon, and between about 40% and about 50% of the nitrogen.

2. The barrier layer of claim 1, wherein the silicon is doped with conductivity enhancing impurities.

3. The barrier layer of claim 1, wherein the transition metal is titanium or tantalum.

4. A barrier layer on a semiconductor substrate formed of a composition comprising:

a transition metal;

aluminum;

silicon;

nitrogen, wherein the composition comprises between about 30% and about 40% of the transition metal, between about 10% and about 20% of the aluminum, between about 0.5% and about 10% of the silicon, and between about 40% and about 50% of the nitrogen; and wherein the layer is deposited onto a surface of the semiconductor device by reactive sputtering, chemical vapor deposition, or plasma enhanced chemical vapor deposition.

5. The barrier layer of claim 4, wherein the transition metal is titanium or tantalum.

6. A device comprising:

a semiconductive substrate layer; and a barrier layer formed of a composition comprising;

a transition metal;

aluminum;

silicon; and nitrogen, wherein the composition comprises between about 30% and about 40% of the transition metal, between about 10% and about 20% of the aluminum, between about 0.5% and about 10% of the silicon, and between about 40% and about 50% of the nitrogen.

7. The device of claim 6, wherein the transition metal is titanium or tantalum.

8. The device of claim 6, further comprising a conductive layer.

9. The device of claim 6, further comprising a conductive layer on the barrier layer, and the barrier layer on the semiconductive substrate layer.

10. The device of claim 6, wherein the conductive layer comprises aluminum.

11. The device of claim 6, wherein the barrier layer is deposited onto the semiconductive substrate layer by reactive sputtering, chemical vapor deposition, or plasma enhanced chemical vapor deposition.

12. The device of claim 6, further comprising an insulative layer.

13. A semiconductor device comprising:

a semiconductive substrate layer;

a conductive layer; and a barrier layer deposited at an interface between the semiconductive substrate layer and the conductive layer, wherein the barrier layer is formed of a composition comprising;

a transition metal;

aluminum;

silicon; and nitrogen, wherein the composition comprises between about 30% and about 40% of the transition metal, between about 10% and about 20% of the aluminum, between about 0.5% and about 10% of the silicon, and between about 40% and about 50% of the nitrogen.

14. The semiconductor device of claim 13, wherein the transition metal is titanium or tantalum.

15. The semiconductor device of claim 13, further comprising an insulative layer.

16. The semiconductor device of claim 13, wherein the barrier layer is deposited by reactive sputtering, chemical vapor deposition, or plasma enhanced chemical vapor deposition.

17. The semiconductor device of claim 13, wherein the conductive layer comprises aluminum.

18. The semiconductor device of claim 13, wherein the semiconductive substrate layer comprises silicon or silicon dioxide.

19. The semiconductor device of claim 13, wherein the thickness of the barrier layer is less than about 3000 Å.

20. The semiconductor device of claim 13, wherein the thickness of the barrier layer is between about 50 Å and about 3000 Å.

21. The semiconductor device of claim 13, wherein the semiconductive substrate layer comprises silicon or silicon dioxide.

22. The semiconductor device of claim 13, wherein the thickness of the barrier layer is less than about 3000 Å.

23. The semiconductor device of claim 13, wherein the thickness of the barrier layer is between about 50 Å and about 2000 Å.

* * * * *